(12) United States Patent
Sakurai et al.

(10) Patent No.: US 6,175,284 B1
(45) Date of Patent: Jan. 16, 2001

(54) TEMPERATURE-COMPENSATED CRYSTAL OSCILLATOR HAVING CONSTANT VOLTAGE GENERATOR WITH FILTER

(75) Inventors: Yasuhiro Sakurai; Hiroyuki Fukayama, both of Sayama (JP)

(73) Assignee: Citizen Watch Co., Ltd., Tokyo (JP)

( * ) Notice: Under 35 U.S.C. 154(b), the term of this patent shall be extended for 0 days.

(21) Appl. No.: 09/395,929

(22) Filed: Sep. 14, 1999

(30) Foreign Application Priority Data

Sep. 18, 1998 (JP) .................................................. 10-264382

(51) Int. Cl.[7] ................................. H03B 5/36; H03L 1/00
(52) U.S. Cl. ..................... 331/116 FE; 331/158; 331/176
(58) Field of Search ........................... 331/116 R, 116 FE, 331/158, 176

(56) References Cited

U.S. PATENT DOCUMENTS 4,587,499 * 5/1986 Miyayama ............................ 331/176

FOREIGN PATENT DOCUMENTS

11234040 * 8/1999 (JP) .

* cited by examiner

*Primary Examiner*—Siegfried H. Grimm
(74) *Attorney, Agent, or Firm*—Armstrong, Westerman, Hattori, McLeland & Naughton

(57) ABSTRACT

A constant voltage generation circuit (10) for driving a temperature-compensated crystal oscillation circuit (1) comprises a differential circuit (5), a dc load (7) for supplying feedback signals to the differential circuit (5), a driver (4) for driving the dc load (7) and the temperature-compensated crystal oscillation circuit (1) under control by control signals outputted by the differential circuit (5), and a low-pass filter (13) made up of passive elements only and for applying the control signals to the driver (9) after removing high frequency components out of the control signals, thereby preventing an increase of phase noise while achieving low power consumption.

8 Claims, 3 Drawing Sheets

TEMPERATURE-COMPENSATED CRYSTAL OSCILLATOR HAVING CONSTANT VOLTAGE GENERATOR WITH FILTER

BACKGROUND OF THE INVENTION

1. Field of the Invention

The present invention relates to a temperature-compensated crystal oscillator mounted in communications equipment such as a cellular phone, and the like.

2. Description of the Related Art

A temperature-compensated crystal oscillator mounted in communications equipment comprises a crystal oscillation circuit incorporating an AT-cut crystal resonator (unit) in a frequency band of 10 MHz as the oscillation source thereof, and a temperature-compensated circuit using a frequency adjustment circuit for adjusting an oscillation frequency of the crystal oscillation circuit so as to stabilize the oscillation frequency by canceling out the cubic curve temperature characteristic of the AT-cut crystal resonator.

Since the temperature-compensated crystal oscillator is mounted in portable communications equipment, there is a requirement that its power consumption is low. However, the temperature-compensated crystal oscillator is specified such that the power source thereof is to be kept turned off during most of the time when standing by for phone calls, and consequently, even a product thereof with a power source at 3V, having current consumption of not less than 1mA, has been permissible in the past.

As there has recently been seen a mounting trend of adopting the CDMA (code division multiple access) system aiming at international sharing of a common communications system, and under the specification of the CDMA system, the temperature-compensated crystal oscillator is required not to turn the power source thereof off even during periods of standing by for phone calls, there has been an increasing demand for further lower power consumption.

Now, the most effective method of achieving lower power consumption is to lower a driving voltage of the crystal oscillation circuit.

Accordingly, for a temperature-compensated crystal oscillator aiming at lower power consumption, a configuration is adopted wherein a temperature-compensated crystal oscillation circuit is driven by a constant voltage generation circuit (a voltage regulator).

FIG. 5 shows a configuration of such a conventional temperature-compensated crystal oscillator by way of example.

With this type of temperature-compensated crystal oscillator, a temperature-compensated crystal oscillation circuit 1 is driven by a constant voltage generation circuit 3.

The constant voltage generation circuit 3 comprises a differential circuit 5 supplied with a reference voltage A as one of the inputs, a dc load 7, a driver 9 by use of a FET for driving the dc load 7 and the temperature-compensated crystal oscillation circuit 1 under control of the differential circuit 5, and a phase-compensation capacitor 11 for prevention of self-oscillation.

The dc load 7 has a function of supplying feedback signals to the differential circuit 5, and determining a ratio of the reference voltage A to a driving voltage for the temperature-compensated crystal oscillation circuit 1, that is, an amplification factor. In this example, the dc load 7 comprises a first resistance 7a and a second resistance 7b that are identical in kind and connected in series.

The differential circuit 5 shown in FIG. 5 is made up of 4 units of CMOS FETs, Q1 to Q4, using either an n-type substrate or a p-type substrate, however, it can also be made up of bipolar transistors.

Further, the dc load 7 is not essential in the constant voltage generation circuit 3. If the reference voltage A equivalent to the driving voltage for the temperature-compensated crystal oscillation circuit 1 is available, the dc load 7 may be dispensed with, and an output of the constant voltage generation circuit 3 may be supplied straight to the differential circuit 5 as the feedback signals thereto.

In any case, lower power consumption of the temperature-compensated crystal oscillator can be achieved by rendering the driving voltage for the temperature-compensated crystal oscillation circuit 1 lower than a source voltage V1–V2 (normally, V2 is a ground potential) with the use of the constant voltage generation circuit 3.

However, in the case where the temperature-compensated crystal oscillation circuit 1 is driven by use of the constant voltage generation circuit 3 in this way, there will arise a problem that phase noise increases in comparison with a case where the temperature-compensated crystal oscillation circuit is driven directly by the source voltage. The reason for this is described hereinafter.

With the conventional temperature-compensated crystal oscillator of a low-power-consumption type as shown in FIG. 5, the constant voltage generation circuit 3 is made up of the driver 9, the differential circuit 5, and so forth. The temperature-compensated crystal oscillation circuit 1 is driven by the output of the constant voltage generation circuit 3, and it is a general practice to use feedback control as means of maintaining voltage constancy of the driving voltage.

Meanwhile, the temperature-compensated crystal oscillation circuit 1 is a stable load on a long term basis, however, it has a characteristic of current thereof pulsating on a shorter term basis, depending on a phase condition of oscillation. That is, it is a load having a property of its impedance undergoing changes on a shorter term basis.

If such a variable load on a short term basis is driven by the conventional constant voltage generation circuit 3, an output voltage of the driver 9 is subjected to pulsation due to the effect of variation in the load, so that signals fed back to the differential circuit 5 are caused to pulsate as well.

In such a case, the voltage regulator acts to perform an operation so as to cancel out variation in the load in order to keep the output voltage thereof at a constant level.

If the voltage regulator has a response speed fast enough to be able to follow the variation in the load at a frequency of the temperature-compensated crystal oscillation circuit 1, the output voltage can be maintained at the constant level.

However, in the constant voltage generation circuit 3, it is extremely difficult to operate the differential circuit 5 controlling the driver 9 at such a high speed enabling the same to follow the variation in the load of the temperature-compensated crystal oscillation circuit 1 in the frequency band of 10 MHz.

Accordingly, in response to the variation in the frequency band of 10 MHz of the temperature-compensated crystal oscillation circuit 1, the constant voltage generation circuit 3 performs an operation so as to compensate for the variation in the load at a frequency (for example, in the order of 1 kHz) lower than that for the former.

More specifically, the variation in the load proceeds at a speed higher than a speed at which the constant voltage generation circuit 3 operates to maintain the output voltage thereof at the constant level. Hence the output voltage can not be maintained at the constant level, exhibiting a characteristic of undergoing variation at a frequency lower than the frequency band of 10 MHz.

Since an oscillation frequency of the temperature-compensated crystal oscillation circuit 1 varies depending on the driving voltage, the oscillation frequency of the temperature-compensated crystal oscillation circuit 1 undergoes fine modulation when the output voltage of the constant voltage generation circuit 3 varies at a certain frequency.

The fine modulation of the oscillation frequency will show up in the form of deterioration in phase noise.

With the conventional voltage regulator, a response frequency of the differential circuit is in the order of several 10 kHz. In the case of such a constant voltage generation circuit 3 as above, if deviation from the oscillation frequency of the temperature-compensated crystal oscillation circuit falls in the range within several 10 kHz, phase noise will undergo deterioration.

It is required under the present specification of the cellular phone that phase noise must be low when deviation from the oscillation frequency falls in the range of 1 Hz to 100 kHz, and hence, with the conventional constant voltage generation circuit, phase noise is caused to deteriorate in a large part of the range of deviation as described.

SUMMARY OF THE INVENTION

The invention has been developed in light of the problems described in the foregoing, and it is an object of the invention to achieve low power consumption of a temperature-compensated crystal oscillator by driving the same at a low voltage while preventing an increase of phase noise.

To this end, with a temperature-compensated crystal oscillator according to the invention, wherein a temperature-compensated crystal oscillation circuit is driven by a constant voltage generation circuit, the constant voltage generation circuit is made up as follows.

That is, the constant voltage generation circuit comprises a driver for driving the temperature-compensated crystal oscillation circuit, a control signal generation circuit for generating control signals for controlling the driver, and a low-pass filter made up of passive elements only and for applying the control signals generated by the control signal generation circuit to the driver after removing high frequency components out of the control signals.

The control signal generation circuit can be made up of a differential circuit and a dc load for supplying feedback signals to the differential circuit.

The constant voltage generation circuit may comprise a differential circuit, a dc load for supplying feedback signals to the differential circuit, a first driver for driving the dc load under control by control signals generated by the differential circuit, a second driver which is the same kind of device as is used for the first driver, and for driving the temperature-compensated crystal oscillation circuit under control by the control signals, and a low-pass filter made up of passive elements only and for applying the control signals generated by the differential circuit to the second driver after removing high frequency components out of the control signals.

A phase-compensation capacitor may be coupled between a control terminal of the first driver and an output terminal thereof.

Otherwise, the constant voltage generation circuit may comprise a constant current load, a first driver for driving the constant current load and generating control signals, a second driver which is the same kind of device as is used for the first driver, and for driving the temperature-compensated crystal oscillation circuit under control by the control signals, and a low-pass filter made up of passive elements only and for applying the control signals outputted by the first driver to the second driver after removing high frequency components out of the control signals.

With the temperature-compensated crystal oscillator according to the invention, it is desirable that a cut-off frequency of the low-pass filter is not higher than 1 Hz.

The above and other objects, features and advantages of the invention will be apparent from the following detailed description which is to be read in conjunction with the accompanying drawings.

DETAILED DESCRIPTION OF THE PREFERRED EMBODIMENTS

Figure 1:
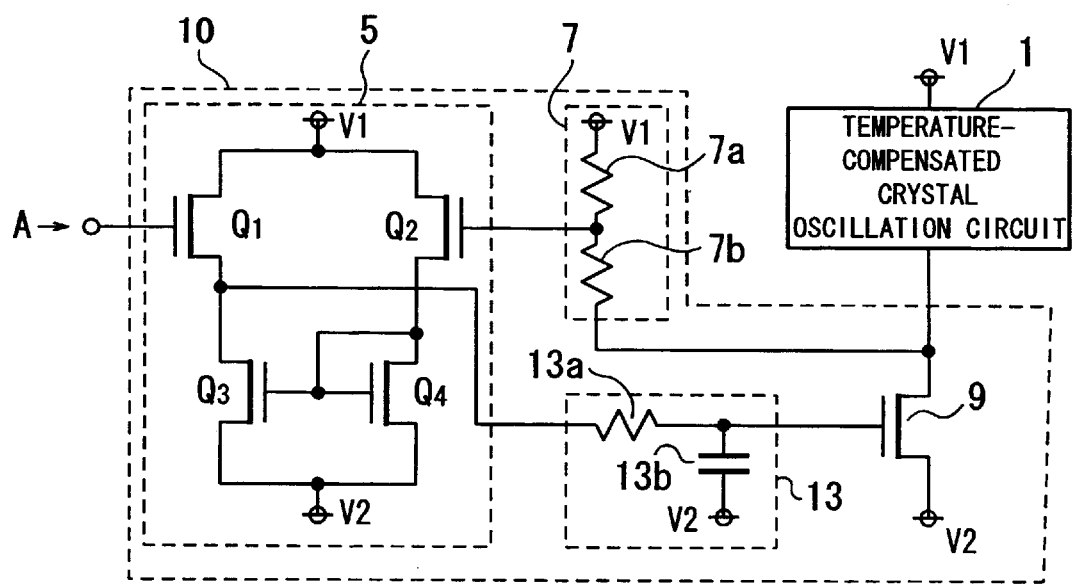
FIG. 1 is a block diagram showing a configuration of the first embodiment of a temperature-compensated crystal oscillator according to the invention.

Preferred embodiments of a temperature-compensated crystal oscillator according to the invention are described hereinafter with reference to the accompanying drawings.
First Embodiment: FIG. 1

First, a first embodiment of the invention is described. FIG. 1 is a block diagram showing a configuration of the first embodiment of a temperature-compensated crystal oscillator according to the invention.

As shown in FIG. 1, with the temperature-compensated crystal oscillator, a temperature-compensated crystal oscillation circuit 1 is driven by a constant voltage generation circuit 10.

The constant voltage generation circuit 10 is made up of a control signal generation circuit comprising a differential circuit 5 supplied with a reference voltage A as one of the inputs and a dc load 7 for supplying feedback signals to the differential circuit 5, a driver 9 comprising a FET for driving the dc load 7 and a temperature-compensated crystal oscillation circuit 1, and a low-pass filter 13 for removing high frequency components out of control signals, outputted by the differential circuit 5 and for controlling the driver 9.

The differential circuit 5 is made up of 4 units of CMOS FETs, Q1 to Q4, and the dc load 7 comprises a first resistance 7a and a second resistance 7b that are identical in kind and connected in series.

Further, the low-pass filter 13 is made up of passive elements only, and in the case of this example, made up of a resistance 13a and a capacitor 13b.

As principal factors that cause deviation of an output voltage of a constant voltage generation circuit from a set value, there are generally cited variation in a source voltage, manufacturing variation of device characteristics, variation in a load, and so forth.

And a way to cope with the principal factors for these variations is so-called feedback control whereby an output of a driver or a divided voltage thereof is fed back to a differential circuit.

In the constant voltage generation circuit 10 shown in FIG. 1, a divided voltage of an output of the driver 9 is fed back to the differential circuit 5 from the dc load 7. That is, the driver 9 and the dc load 7 make up a feedback loop.

By the agency of the feedback, the output of the driver 9 will not vary depending on variation in the source voltage, manufacturing variation of the device characteristic, and variation in the load, and can be maintained at a constant value, that is, the reference voltage A multiplied by a constant factor. Such a configuration is the same as that of the conventional example shown in FIG. 5.

Now, since the driver 9 drives the temperature-compensated crystal oscillation circuit 1 which is a variable load in the short term, the driving voltage thereof undergoes pulsation due to the effect of variation of the load.

Consequently, the feedback signals fed back from the dc load 7 to the differential circuit 5 are caused to pulsate, thereby causing a change of an operating point of the differential circuit 5.

If the differential circuit 5 can operate at a sufficiently high speed, it can operate following pulsation of the feedback signals, and a frequency at which the operating point undergoes variation will therefore coincide with the oscillation frequency of the temperature-compensated crystal oscillation circuit 1.

However, if the differential circuit 5 should operate at too high a speed, the constant voltage generation circuit 3 would be subjected to self-oscillation. Accordingly, the differential circuit 5 must be prevented from operating at a high speed normally by means of reducing current flowing therethrough, and so forth.

As a result, the differential circuit 5 is unable to follow pulsation of the feedback signals, and the maximum frequency of variation in the control signals to the driver 9 becomes lower than the frequency of pulsation in the feedback signals, that is, the oscillation frequency of the temperature-compensated crystal oscillation circuit 1 (in the 10 MHz band). It is normally in the order of several 10 kHz.

Figure 5:
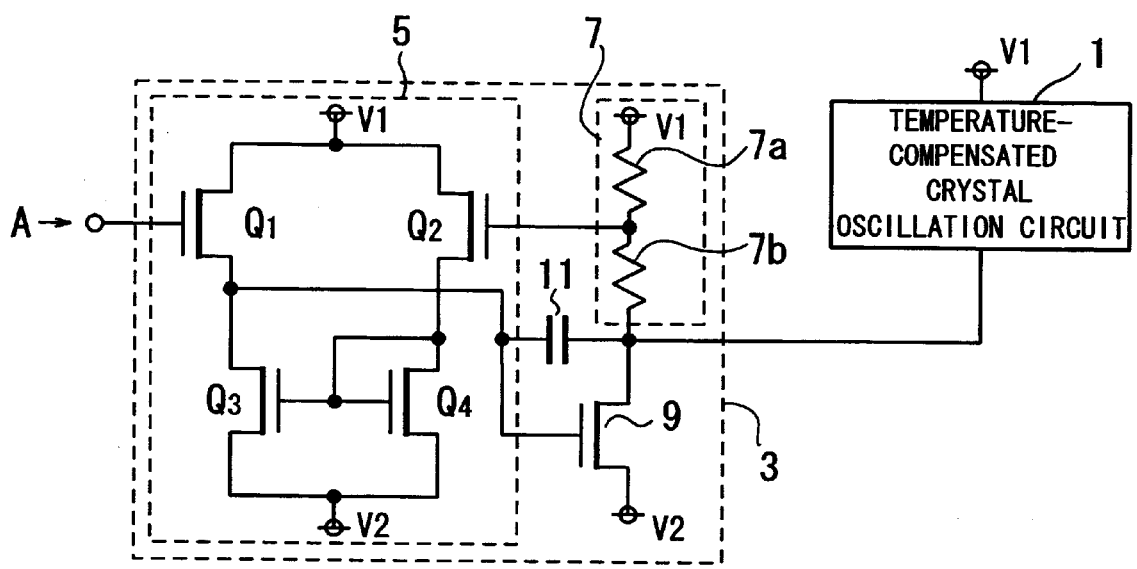
FIG. 5 is a block diagram showing a configuration of a conventional temperature-compensated crystal oscillator by way of example.

As described in the foregoing, in the case of the conventional example shown in FIG. 5, the driver 9 is directly controlled by the control signals varying at such frequencies, so that the driving voltage undergoes variation at frequencies differing from the oscillation frequency of the temperature-compensated crystal oscillation circuit 1, thereby causing deterioration of phase noise with deviation from the oscillation frequency falling in the range within several 10 kHz.

In contrast, the temperature-compensated crystal oscillator according to the invention shown in FIG. 1 has a configuration wherein the control signals outputted from the differential circuit 5 of the control signal generation circuit are not directly applied to the driver 9, but applied thereto via the low-pass filter 13.

With such a configuration, fluctuation frequency components of the control signals applied to the driver 9 will be lower than a cut-off frequency of the low-pass filter 13.

As a result, deterioration of phase noise caused by the constant voltage generation circuit 10 will be limited to a scope of deviation from the oscillation frequency of the temperature-compensated crystal oscillation circuit 1 falling in the range not higher than the cut-off frequency of the low-pass filter 13, and phase noise in the case of the deviation falling in the range higher than that will be equivalent to phase noise in the case of the temperature-compensated crystal oscillation circuit 1 being directly driven with the source voltage.

As it is required under the present specification of the cellular phone that phase noise must be low when the deviation from the oscillation frequency is in the range of 1 Hz to 100 kHz, such requirement can be met by setting the cut-off frequency of the low-pass filter 13 at not higher than 1 Hz even in the case of the temperature-compensated crystal oscillator using the constant voltage generation circuit 3.

Deterioration of phase noise due to use of the constant voltage generation circuit 10 described above will cause no problem because the deviation from the oscillation frequency is in the range not higher than 1 Hz.

Thus, with the first embodiment of the invention, even though the constant voltage generation circuit is adopted in order to achieve low power consumption of the temperature-compensated crystal oscillator, it is possible to prevent phase noise from deteriorating within the range of the deviation as required.

Now, a configuration of the low-pass filter 13 used in carrying out the invention is described hereinafter.

In the first embodiment shown in FIG. 1, the low-pass filter is made up of a resistance 13a and a capacitor 13b. Assuming that respective values are R ($\omega$), and C (F), the cut-off frequency becomes $\frac{1}{2\pi}$ RC. Hence, respective values may be selected such that $\frac{1}{2\pi}$ RC will be not higher than 1 Hz. For example, the resistance 13a may be set at about 100M ($\omega$), and the capacitor 13b at about 0.01$\mu$ (F). Obviously, there will be no problem with rendering the cut-off frequency lower than that.

The low-pass filter used in the invention has to be a passive filter made up of passive devices only as shown in FIG. 1, and it should not be an active filter using active devices.

This is because the active filter is made up so as to exhibit its performance by feedback control, and contains noise components that are essentially the same as those of the conventional constant voltage generation circuit.

It follows that the low-pass filter itself for removing noise components comes to generate the noise components.

Since a coil is another passive device besides the resistance and the capacitor, the resistance 13a may be replaced by a coil.

Figure 2:
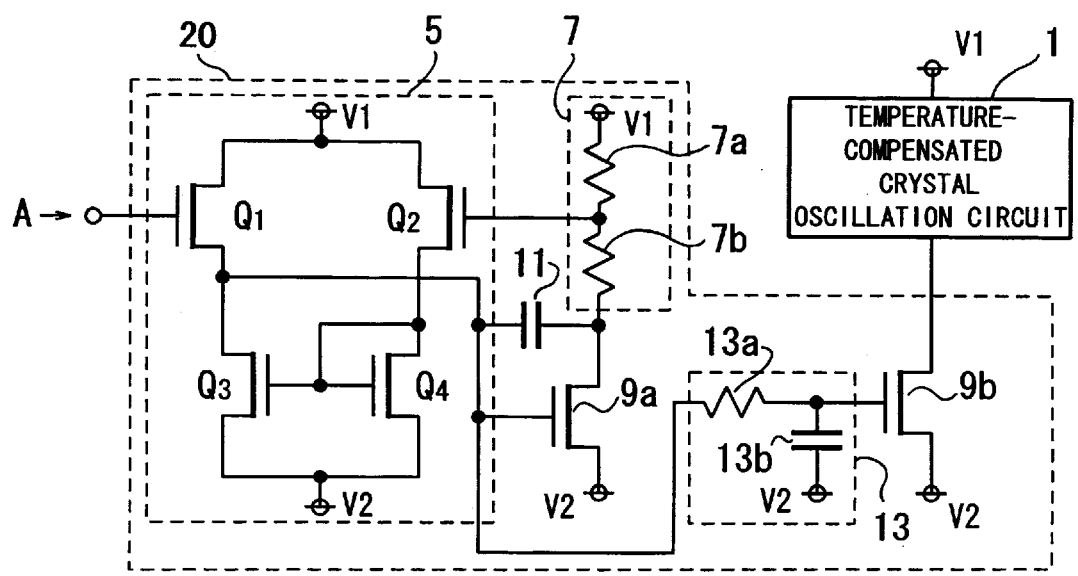
FIG. 2 is a block diagram showing a configuration of the second embodiment of a temperature-compensated crystal oscillator according to the invention.

Second Embodiment: FIG. 2

Next, a second embodiment of the invention is described. FIG. 2 is a block diagram showing a configuration of the second embodiment of a temperature-compensated crystal oscillator according to the invention. Parts corresponding to those in FIG. 1 are denoted by the same reference numerals.

As shown in FIG. 2, with the temperature-compensated crystal oscillator, a temperature-compensated crystal oscillation circuit 1 is driven by a constant voltage generation circuit 20.

The constant voltage generation circuit 20 is made up of a differential circuit 5 supplied with a reference voltage A as one of the inputs, a dc load 7 for supplying feedback signals to the differential circuit 5, a first driver 9a for driving the dc load 7 under control of the differential circuit 5, a second driver 9b for driving the temperature-compensated crystal oscillation circuit 1, a low-pass filter 13 for applying control signals from the first driver 9a to the second driver 9b after removing high frequency components out of the control signals, and a phase-compensation capacitor 11 coupled between a control terminal of the first driver 9a and an output terminal thereof.

A portion of the constant voltage generation circuit 20, excluding the low-pass filter 13 and the second driver 9b, corresponds to the control signal generation circuit of the first embodiment.

The differential circuit 5 is made up of 4 units of CMOS FETs, Q1 to Q4, and the dc load 7 comprises a first resistance 7a and a second resistance 7b that are identical in kind and connected in series.

Further, the low-pass filter 13 is made up of passive elements only, and in the case of this example, it is made up of a resistance 13a and a capacitor 13b. Such a configuration is the same as that for the first embodiment shown in FIG. 1.

The first driver 9a and the second driver 9b are to be made up of a device of an identical kind, respectively.

The phase-compensation capacitor 11 is provided for prevention of self-oscillation, but it is not essential.

With the second embodiment, since the temperature-compensated crystal oscillation circuit 1 and the second driver 9b for driving the former are outside a feedback loop, and the second driver 9b simply receives the control signals of the first driver 9a one-sidedly, it appears that the low-pass filter 13 is unnecessary.

However, the temperature-compensated crystal oscillation circuit 1 causes variation in not only a driving voltage of the second driver 9b but also a source voltage, and consequently, the feedback signals fed back to the differential circuit 5 are caused to undergo variation. As a result, variation causing deterioration of phase noise will be superimposed on the control signals of the first driver 9a.

Even in such a case, it is possible to prevent deterioration of phase noise from occurring within the range of frequency deviation as required by the cellular phones by setting a cut-off frequency of the low-pass filter 13 at not higher than 1 Hz.

As with the case of the second embodiment shown in FIG. 2, a filter effect in the case of a configuration wherein the low-pass filter 13 is installed outside the feedback loop becomes greater than that in the case where the low-pass filter 13 is installed inside the feedback loop.

Figure 3:
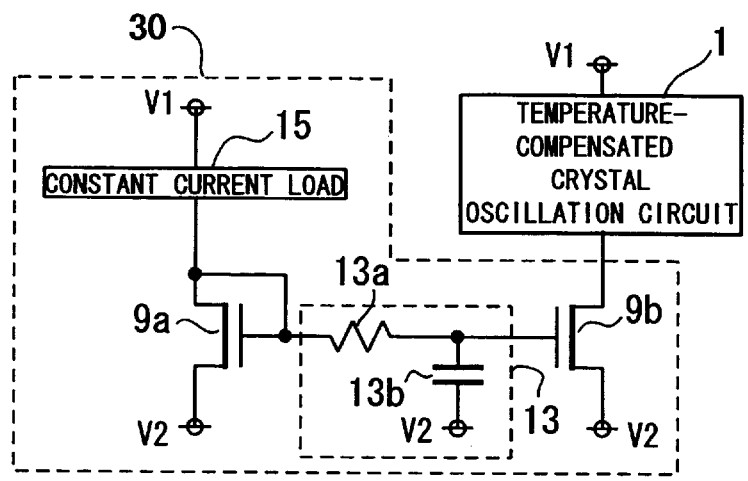
FIG. 3 is a block diagram showing a configuration of the third embodiment of a temperature-compensated crystal oscillator according to the invention.

Third Embodiment: FIG. 3

Next, a third embodiment of the invention is described. FIG. 3 is a block diagram showing a configuration of the third embodiment of a temperature-compensated crystal oscillator according to the invention. Parts corresponding to those in FIGS. 1 and 2 are denoted by the same reference numerals.

As shown in FIG. 3, with the temperature-compensated crystal oscillator, a temperature-compensated crystal oscillation circuit 1 is driven by a constant voltage generation circuit 30.

The constant voltage generation circuit 30 comprises a first driver 9a diode-connected FET for driving a constant current load 15, a second driver 9b for driving the temperature-compensated crystal oscillation circuit 1, and a low-pass filter 13 for applying control signals from the first driver 9a to the second driver 9b after removing high frequency components out of the control signals.

An output voltage of the first driver 9a is substantially at a constant value if a source voltage is not lower than a given value. Accordingly, the third embodiment of the invention has a configuration wherein the second driver 9b is controlled by a constant voltage, and as long as no variation occurs to the constant voltage, the low-pass filter 13 is unnecessary.

However, as the temperature-compensated crystal oscillation circuit 1 causes variation to occur to the source voltage, the output voltage of the first driver 9a undergoes variation. Consequently, deterioration in phase noise still occurs when the second driver 9b is controlled directly by such an output voltage as described.

Even in such a case, deterioration in phase noise can be prevented by removing high frequency components out of the output voltage of the first driver 9a by means of the low-pass filter 13.

Explanation about Improvement on Phase Noise

Now, the extent to which phase noise can be improved by the present invention is now described with reference to FIG. 4.

Figure 4:
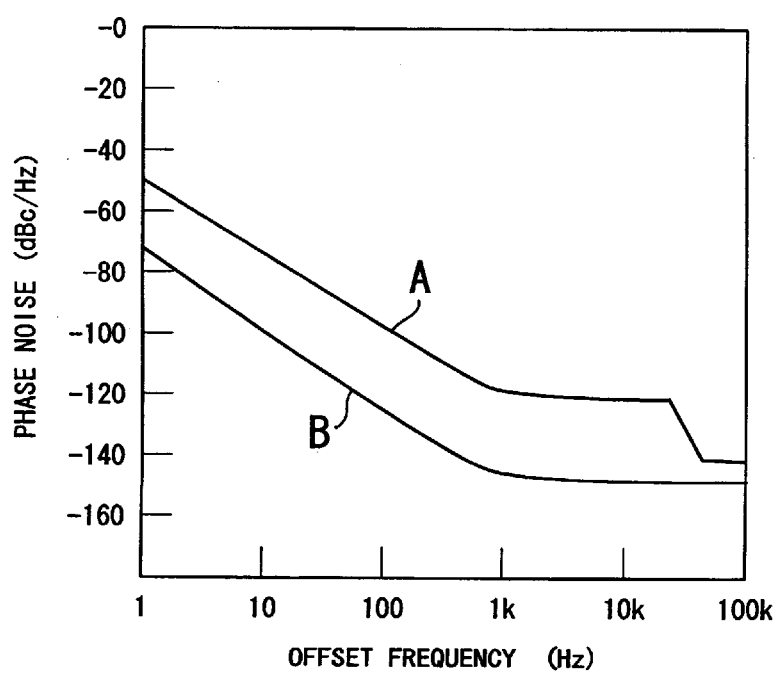
FIG. 4 is a graph showing an example of the phase noise of the temperature-compensated crystal oscillator according to the invention, in comparison with that of the conventional temperature-compensated crystal oscillator.

FIG. 4 is a graph showing measured values of the phase noise of the temperature-compensated crystal oscillator according to the invention, and those of the phase noise of the conventional temperature-compensated crystal oscillator, relative to an offset frequency.

The graph of the phase noise shows that the lower a curve is positioned therein, the lower the phase noise is, and in comparison with the phase noise of the conventional temperature-compensated crystal oscillator denoted by a curve A, the phase noise of the temperature-compensated crystal oscillator according to the invention denoted by a curve B is found to be fairly lower. In particular, in the range of the offset frequency at 1 kHz or higher, the effect for preventing deterioration of the phase noise is seen to be pronounced.

While the three embodiments of the invention have been described as above, it is to be understood that the scope of the invention is not limited thereto, and that various modifications will be apparent to those skilled in the art without departing from the spirit of the invention.

For example, with the embodiments described in the foregoing, the differential circuit and the driver are made up of MOS transistors, respectively, however, these may be made up of bipolar transistors, respectively.

Further, the low-pass filter is made up of one stage of resistance and a capacitor, however, it may be made up of a plurality of stages of resistance and a capacitor.

Effect of the Invention

As described thus far, since the temperature-compensated crystal oscillator according to the invention is configured such that the temperature-compensated crystal oscillation circuit is driven by the constant voltage generation circuit having lower response frequencies by use of the low-pass filter, it is possible to prevent deterioration in phase noise while reducing power consumption.

Accordingly, the invention can exhibit considerably advantageous effects if applied particularly to the temperature-compensated crystal oscillator to be mounted in portable communications equipment of which the CDMA specification is required.

What is claimed is:

1. A temperature-compensated crystal oscillator wherein a temperature-compensated crystal oscillation circuit is driven by a constant voltage generation circuit;
   said constant voltage generation circuit comprising:
   a driver for driving the temperature-compensated crystal oscillation circuit;
   a control signal generation circuit for generating control signals for controlling the driver; and a low-pass filter made up of passive elements only and for applying the control signals generated by the control signal generation circuit to the driver after removing high frequency components out of the control signals.

2. A temperature-compensated crystal oscillator according to claim 1, wherein the control signal generation circuit comprises a differential circuit and a dc load for supplying feedback signals to the differential circuit while the driver drives the dc load as well as the temperature-compensated crystal oscillation circuit.

3. A temperature-compensated crystal oscillator according to claim 1, wherein a cut-off frequency of the low-pass filter is not higher than 1 Hz.

4. A temperature-compensated crystal oscillator wherein a temperature-compensated crystal oscillation circuit is driven by a constant voltage generation circuit;

said constant voltage generation circuit comprising:
a differential circuit;
a dc load for supplying feedback signals to the differential circuit;
a first driver for driving the dc load under control by control signals generated by the differential circuit;
a second driver which is the same kind of device as is used for the first driver, and for driving the temperature-compensated crystal oscillation circuit under control by the control signals; and
a low-pass filter made up of passive elements only, and for applying the control signals generated by the differential circuit to the second driver after removing high frequency components out of the control signals.

5. A temperature-compensated crystal oscillator according to claim 4, wherein a phase-compensation capacitor is coupled between a control terminal of the first driver and an output terminal thereof.

6. A temperature-compensated crystal oscillator according to claim 4, wherein a cut-off frequency of the low-pass filter is not higher than 1 Hz.

7. A temperature-compensated crystal oscillator wherein a temperature-compensated crystal oscillation circuit is driven by a constant voltage generation circuit;

said constant voltage generation circuit comprising:
a constant current load;
a first driver for driving the constant current load and generating control signals;
a second driver which is the same kind of device as is used for the first driver, and for driving the temperature-compensated crystal oscillation circuit under control by the control signals; and
a low-pass filter made up of passive elements only, and for applying the control signals outputted by the first driver to the second driver after removing high frequency components out of the control signals.

8. A temperature-compensated crystal oscillator according to claim 7, wherein a cut-off frequency of the low-pass filter is not higher than 1 Hz.

* * * * *